United States Patent
Castillo Orozco et al.

(10) Patent No.: US 11,889,613 B1
(45) Date of Patent: Jan. 30, 2024

(54) HEATSINK DEVICE WITH MULTIPLE INLETS AND RELATED COMPUTING DEVICE AND METHOD

(71) Applicant: FLUIX INCORPORATED, Tampa, FL (US)

(72) Inventors: Eduardo A. Castillo Orozco, Guayaquil (EC); Abhishek Sastri, Tampa, FL (US)

(73) Assignee: FLUIX INCORPORATED, Orlando, FL (US)

( * ) Notice: Subject to any disclaimer, the term of this patent is extended or adjusted under 35 U.S.C. 154(b) by 494 days.

(21) Appl. No.: 17/186,150

(22) Filed: Feb. 26, 2021

Related U.S. Application Data

(60) Provisional application No. 62/981,728, filed on Feb. 26, 2020.

(51) Int. Cl.
| | |
|---|---|
| *H05K 7/20* | (2006.01) |
| *F28F 23/02* | (2006.01) |
| *G06F 1/20* | (2006.01) |
| *F28F 27/00* | (2006.01) |

(52) U.S. Cl.
CPC ......... *H05K 7/20218* (2013.01); *F28F 23/02* (2013.01); *F28F 27/006* (2013.01); *G06F 1/20* (2013.01); *H05K 7/20254* (2013.01); *H05K 7/20409* (2013.01); *F28F 2250/08* (2013.01)

(58) Field of Classification Search
CPC ........... H05K 7/20218; H05K 7/20254; H05K 7/20409; G06F 1/20; F28F 2250/08; F28F 23/02; F28F 27/006
See application file for complete search history.

(56) References Cited

U.S. PATENT DOCUMENTS

| | | | |
|---|---|---|---|
| 10,270,220 B1 | 4/2019 | Eppich et al. | |
| 10,548,240 B1* | 1/2020 | Iyengar | H05K 7/20254 |
| 2005/0155749 A1* | 7/2005 | Memory | F28D 9/0075 |
| | | | 165/167 |
| 2005/0210906 A1 | 9/2005 | Laufer et al. | |
| 2015/0136372 A1* | 5/2015 | Sherbeck | F28F 3/12 |
| | | | 165/170 |
| 2016/0282053 A1* | 9/2016 | Bardeleben | F28F 9/0253 |
| 2017/0045300 A1* | 2/2017 | Boday | H05K 7/20254 |
| 2017/0055378 A1* | 2/2017 | Zhou | H05K 7/20927 |
| 2017/0092565 A1* | 3/2017 | Chen | H05K 7/20281 |
| 2019/0141861 A1 | 5/2019 | Shedd et al. | |
| 2019/0181071 A1 | 6/2019 | Harris et al. | |
| 2019/0343019 A1* | 11/2019 | Todorovic | H05K 7/20927 |

* cited by examiner

*Primary Examiner* — Jacob R Crum
(74) *Attorney, Agent, or Firm* — Allen, Dyer, Doppelt + Gilchrist, PA

(57) ABSTRACT

A heatsink device is for an electronic component. The heatsink device may include a base plate having a body, and legs extending laterally outward from the body, and defining an opening within the body, and a heat exchanger. The heat exchanger may include a lower body under the base plate and abutting the electronic component, an upper body coupled to the lower body to define a fluid chamber therein, and a medial plate between the lower body and the upper body and having first and second slots therein. The upper body may define first and second inlet passageways respectively aligned with the first and second slots, and an outlet passageway for fluid in the fluid chamber. The first and second slots may be configured to cause the fluid to flow laterally within the fluid chamber.

19 Claims, 29 Drawing Sheets

← 2010

RAW DATA BY: CR # 02/05/2021 11:27:09
PROCESSED DATA BY: EC 2/20/2021

DATA from Workbench Results
Inlet area= 7.85E-05 [m^2]
IHS area= 0.000431 [m^2]
IHS volume= 1.55E-06 [m^3]
IHS height= 1.80 [mm]
Inlet temperature liquid= 80.33 [F]
26.85[C]

| CASE # | ENERGY SOURCE [W m^-3] | TDP COMPUTER CHIP [W] | INLET VELOCITY [m s^-1] | FLOW RATE DUAL INLET [L/hr] | IHS TEMPERATURE [C] | IHS TEMPERATURE [F] | PRESSURE DROP [Pa] |
|---|---|---|---|---|---|---|---|
| DP 1 | 61220000 | 95.0 | 0.15 | 84.8 | 32.548 | 90.6 | 9800.49 |
| DP 2 | 61220000 | 95.0 | 0.3 | 169.6 | 31.603 | 88.9 | 37543.7 |
| DP 0 | 61220000 | 95.0 | 0.45 | 254.4 | 31.098 | 88.0 | 84170.7 |
| DP 3 | 61220000 | 95.0 | 0.6 | 339.1 | 30.814 | 87.5 | 149478 |
| DP 4 | 61220000 | 95.0 | 0.75 | 423.9 | 30.628 | 87.1 | 232617 |
| DP 5 | 61220000 | 95.0 | 0.9 | 508.7 | 30.487 | 86.9 | 335034 |
| DP 6 | 61220000 | 95.0 | 1.05 | 593.5 | 30.385 | 86.7 | 455833 |
| DP 7 | 61220000 | 95.0 | 1.2 | 678.3 | 30.301 | 86.5 | 597074 |

FIG. 17

HEATSINK DEVICE WITH MULTIPLE INLETS AND RELATED COMPUTING DEVICE AND METHOD

RELATED APPLICATION

This application is based upon prior filed Application No. 62/981,728 filed Feb. 26, 2020, the entire subject matter of which is incorporated herein by reference in its entirety.

TECHNICAL FIELD

The present disclosure relates to the field of heat exchangers, and, more particularly, to a heatsink and related methods.

BACKGROUND

Computer Processing Units (CPUs) continue to increase in transistor density and power dissipation. Heat Generation of these processors continues to be the limiting factor in terms of performance. As the processor senses high temperatures, a dynamic frequency scaling protocol is activated to limit frequency in order to cool down the processor to a safe temperature range. In one approach, typical heat exchangers include a heatsink adapted to the processor, and a fan blowing cool air over the heat exchanger are unable to dissipate the high heat generation of modern processors.

Fans and heatsinks have increased in size and surface area to dissipate heat generated from the processor, however this causes undesirable noise and dimension constraints for computer assemblers and consumer computer builders. In one approach, a liquid heatsink device replaces the heatsink and fan device with a liquid domain that contains a more thermally conducting fluid than conventional air. A pump can be used to force liquid through inlet passageways in the lid of the liquid heatsink.

SUMMARY

Generally, a heatsink device is for an electronic component. The heatsink device may include a base plate having a body, and a plurality of legs extending laterally outward from the body, and defining an opening within the body, and a heat exchanger. The heat exchanger may include a lower body under the base plate and abutting the electronic component, an upper body coupled to the lower body to define a fluid chamber therein, and a medial plate between the lower body and the upper body and having first and second slots therein. The upper body may define first and second inlet passageways respectively aligned with the first and second slots, and an outlet passageway for fluid in the fluid chamber. The first and second slots may be configured to cause the fluid to flow laterally within the fluid chamber.

More specifically, the upper body may comprise an upper surface, and a lower surface opposite the upper surface. The lower surface may comprise a medial protrusion extending downward towards the medial plate. The medial protrusion may extend through the opening of the base plate. The lower surface may comprise a peripheral channel surrounding the medial protrusion.

Also, the medial protrusion may comprise first and second arms respectively overlapping the first and second inlet passageways. The medial protrusion may be U-shaped and may define a medial recess between the first and second arms. The first and second arms may respectively comprise first and second recesses. The lower body may comprise a plurality of fins, and a peripheral ridge surrounding the plurality of fins. The upper body may comprise first and second fluid conduits respectively fluidly coupled to the first and second inlet passageways, and each of the first and second fluid conduits may have a canted wall to define a funnel. Each of the first and second inlet passageways, and the outlet passageway may be canted at an inlet angle α of 30°-90° from a horizontal.

Another aspect is directed to a computing device comprising an electronic component, and a heatsink device abutting the electronic component. The heatsink device may comprise a base plate having a body, and a plurality of legs extending laterally outward from the body, and defining an opening within the body. The heatsink device may include a heat exchanger comprising a lower body under the base plate and abutting the electronic component, an upper body coupled to the lower body to define a fluid chamber therein, and a medial plate between the lower body and the upper body and having first and second slots therein. The upper body may define first and second inlet passageways respectively aligned with the first and second slots, and an outlet passageway for fluid in the fluid chamber. The first and second slots may be configured to cause the fluid to flow laterally within the fluid chamber. The computing device may comprise a radiator fluidly coupled to the heatsink device.

Yet another aspect is directed to a method for making a heatsink device for an electronic component. The method may include forming a base plate having a body, and a plurality of legs extending laterally outward from the body, and defining an opening within the body. The method may further comprise forming a heat exchanger comprising a lower body under the base plate and abutting the electronic component, an upper body coupled to the lower body to define a fluid chamber therein, and a medial plate between the lower body and the upper body and having first and second slots therein. The upper body may define first and second inlet passageways respectively aligned with the first and second slots, and an outlet passageway for fluid in the fluid chamber. The first and second slots may be configured to cause the fluid to flow laterally within the fluid chamber.

BRIEF DESCRIPTION OF THE DRAWINGS

FIGS. 17-20 are diagrams showing performance of an example embodiment of the heatsink device, according to the present disclosure.

DETAILED DESCRIPTION

Figure 1A:
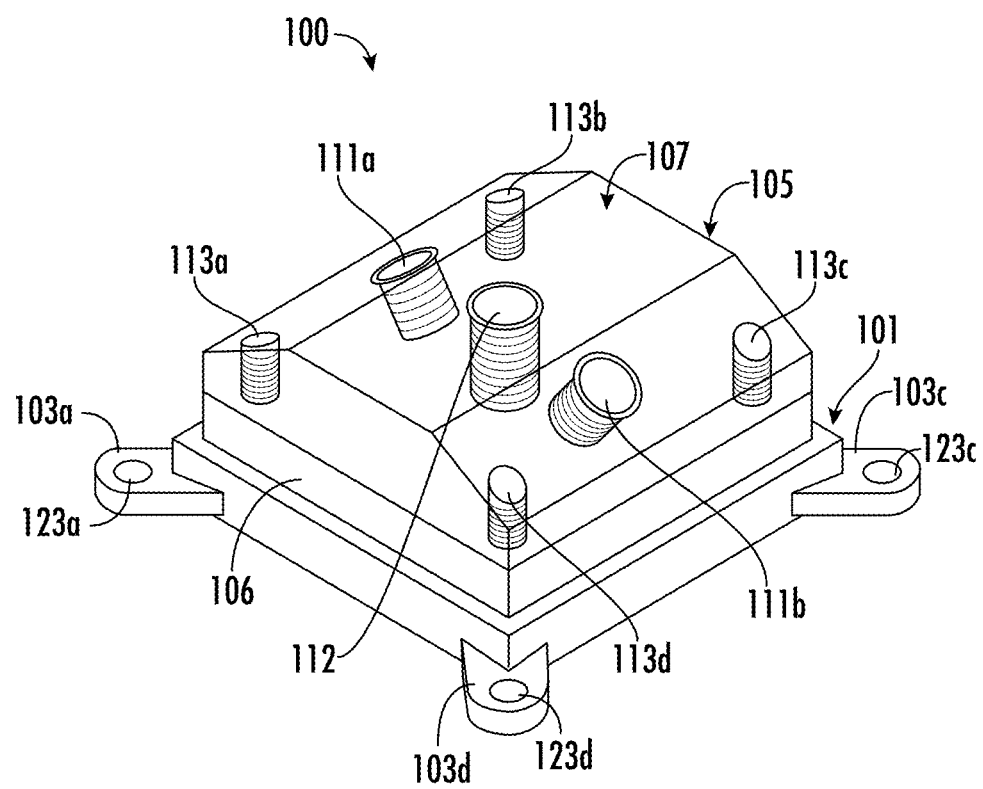
FIG. 1A is a schematic perspective view of a heatsink device, with the upper body of the heat exchanger being partially transparent, according to the present disclosure.
Figure 1B:
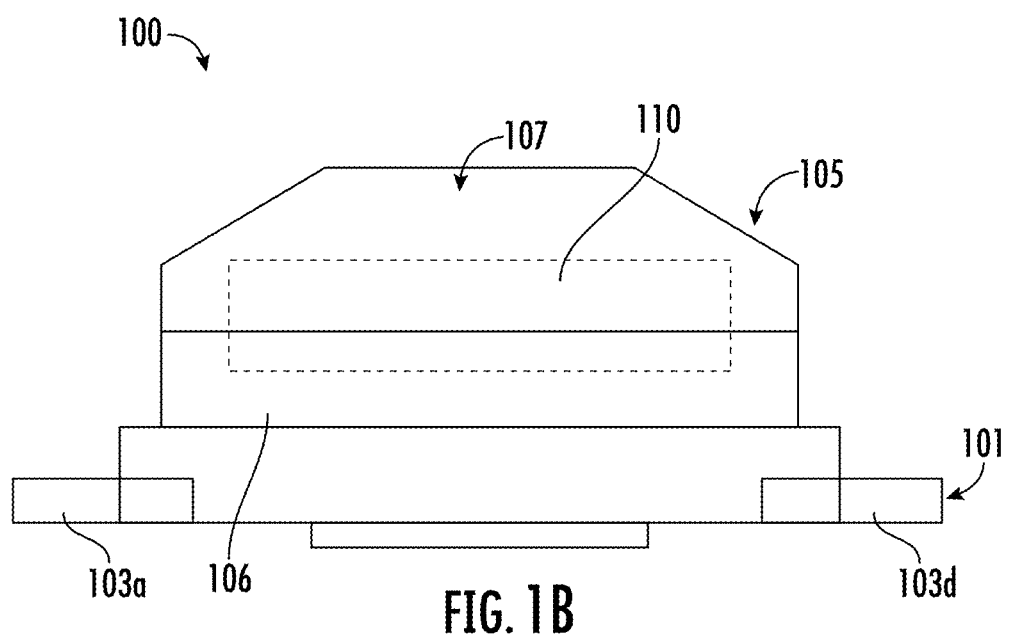
FIG. 1B is a schematic side view of the heatsink device of FIG. 1.
Figure 2:
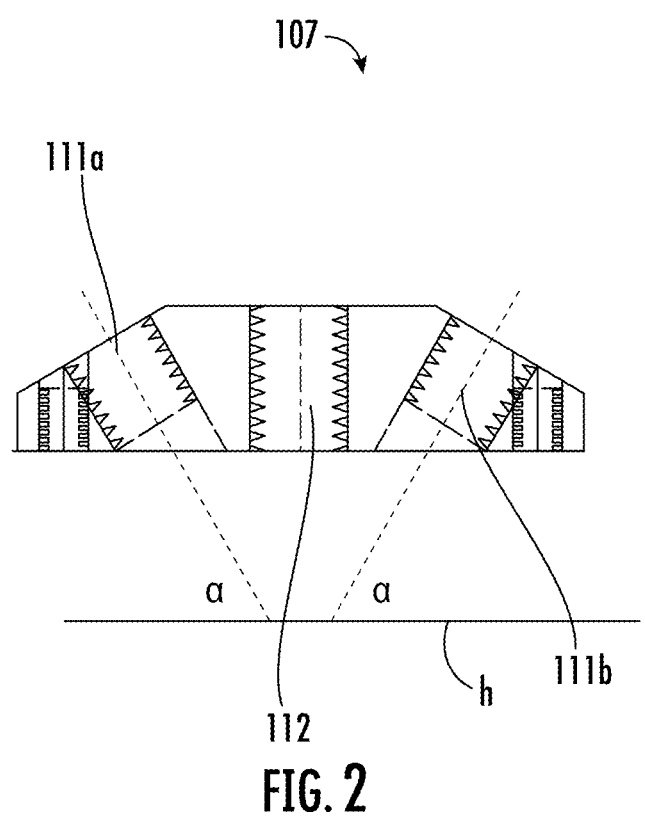
FIG. 2 is a schematic cross-section view of the upper body from the heat exchanger from the heatsink device of FIG. 1.
Figure 3A:
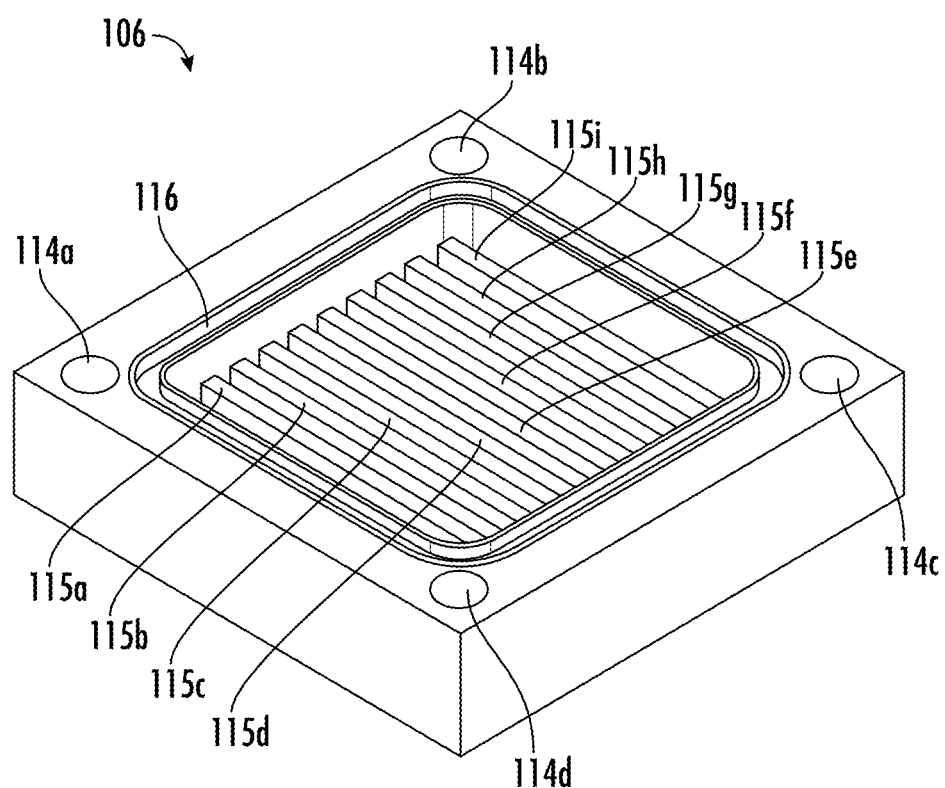
FIG. 3A is a schematic perspective view of the lower body from the heat exchanger from the heatsink device of FIG. 1.
Figure 3B:
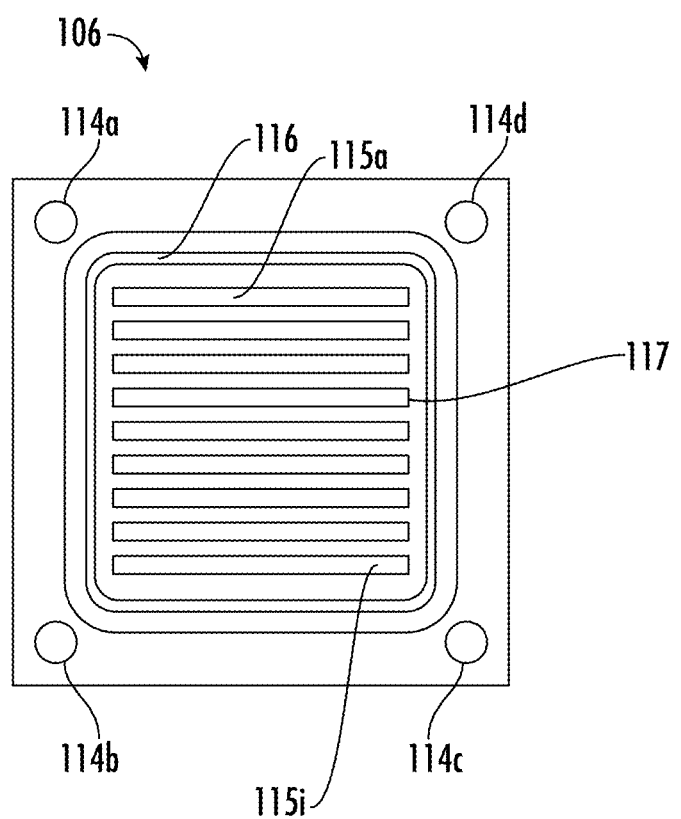
FIG. 3B is a schematic top plan view of the lower body from the heat exchanger from the heatsink device of FIG. 1.
Figure 3C:
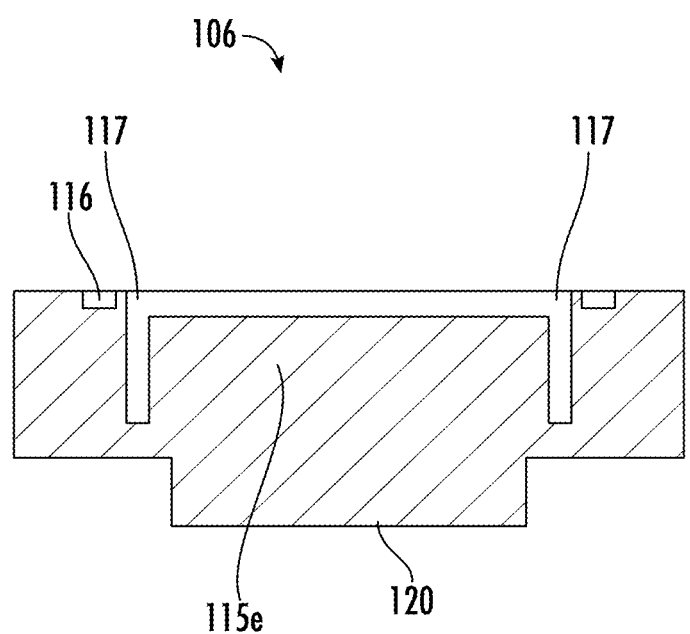
FIG. 3C is a schematic cross-section view of the lower body from the heat exchanger from the heatsink device of FIG. 1 along line A-A.
Figure 4A:
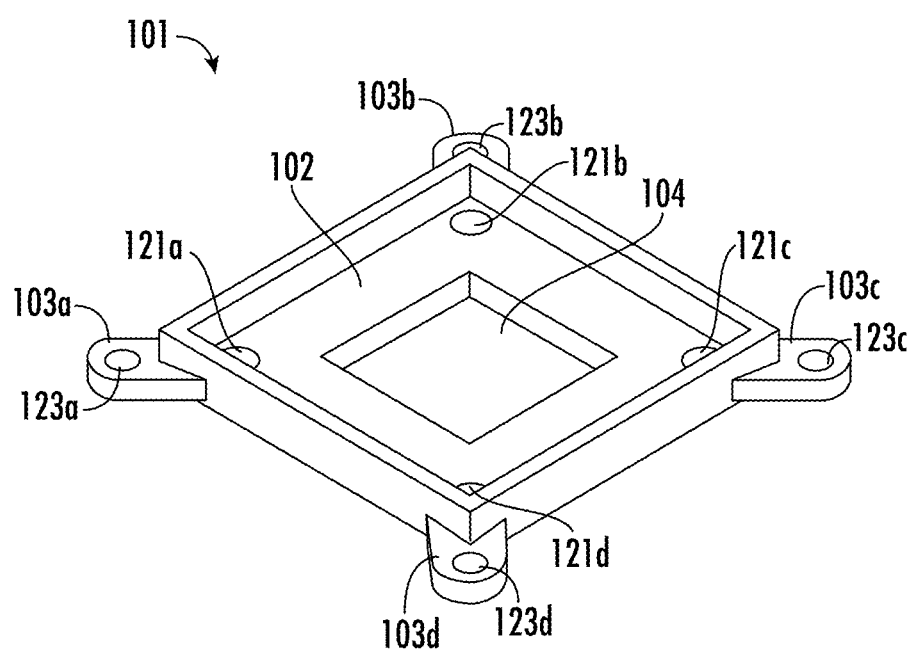
FIG. 4A is a schematic perspective view of the base plate from the heat exchanger from the heatsink device of FIG. 1.
Figure 4B:
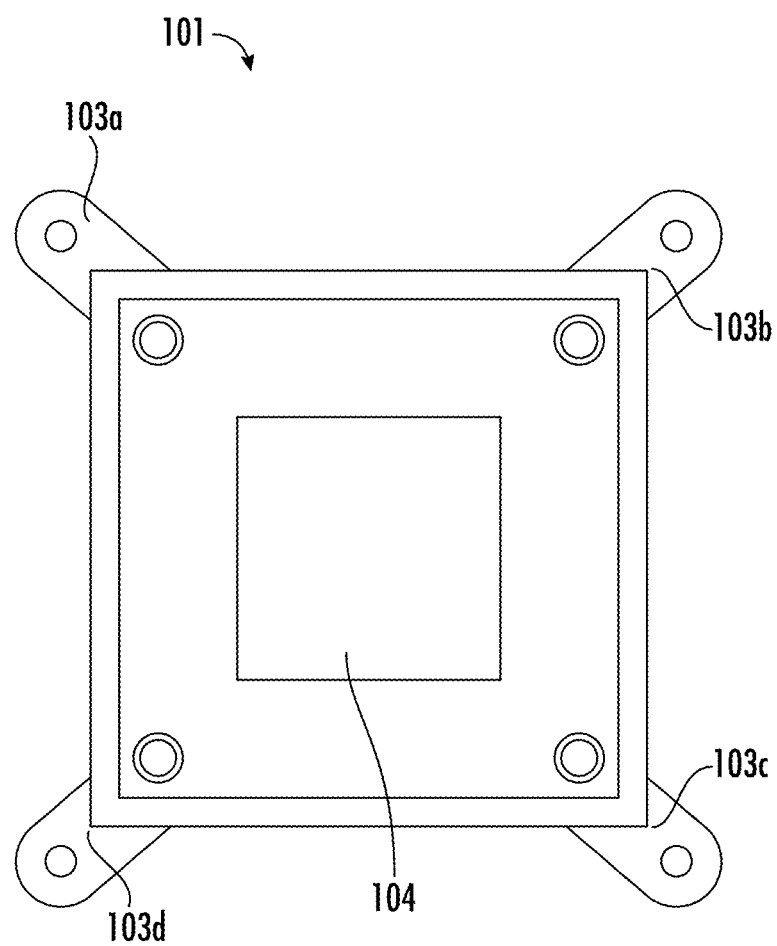
FIG. 4B is a schematic top plan view of the base plate from the heat exchanger from the heatsink device of FIG. 1.
Figure 4C:
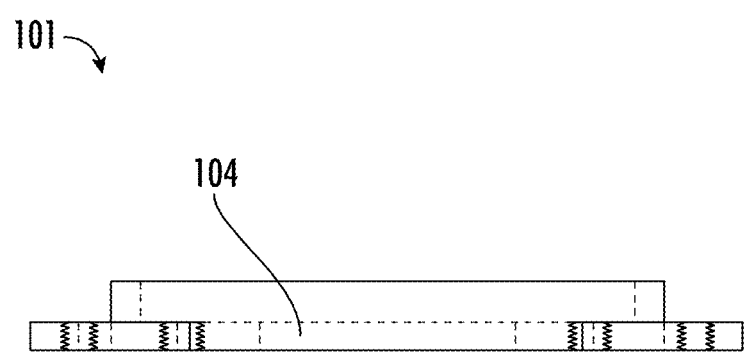
FIG. 4C is a schematic side view of the base plate from the heat exchanger from the heatsink device of FIG. 1.

The present disclosure will now be described more fully hereinafter with reference to the accompanying drawings, in which several embodiments of the invention are shown. This present disclosure may, however, be embodied in many different forms and should not be construed as limited to the embodiments set forth herein. Rather, these embodiments are provided so that this disclosure will be thorough and complete, and will fully convey the scope of the present disclosure to those skilled in the art. Like numbers refer to like elements throughout, and base 100 reference numerals are used to indicate similar elements in alternative embodiments.

Referring initially to FIGS. 1A-4C, a heatsink device 100 is for an electronic component (e.g. processing unit, graphics processing unit (GPU)). The heatsink device 100 illustratively comprises a base plate 101 having a body 102, and a plurality of legs 103a-103d extending laterally outward from the body. The body 102 defines an opening 104 within the body. The opening 104 is to receive the electronic component, permitting to heatsink device 100 to sit and thermally conduct from the electronic component.

The heatsink device 100 illustratively comprises a heat exchanger 105 comprising a lower body 106 over the base plate 101 and abutting the electronic component, and an upper body 107 coupled to the lower body to define a fluid chamber 110 therein. The heatsink device 100 may comprise any material with sufficient thermal conductivity, for example, aluminum, copper.

The upper body 107 defines first and second inlet passageways 111a-111b, and an outlet passageway 112 for permitting fluid passing respectively in and out of the fluid chamber 110. In the illustrated embodiment, each of the first and second inlet passageways 111a-111b, and the outlet passageway 112 has a circular cross-section shaped passageway. Of course, in other embodiments, the passageways may have other shapes, such as a rectangular cross-section shaped or oval cross-section shaped.

In the illustrated embodiment, each of the first and second inlet passageways 111a-111b is canted at an inlet angle $\alpha$ of 60° from a horizontal h. The outlet passageway 112 is normal to the horizontal h and between the first and second inlet passageways 111a-111b. Although the illustrated embodiment includes a single outlet passageway 112, other embodiments may include additional outlet passageways. The inlet angle $\alpha$ is advantageous for heat exchanger performance.

In Table 1 below, one exemplary study is shown for the heat sink device 100. The heatsink device 100 can remove $15 \times 10^6$ W/m$^3$ of thermal energy generated by a CPU with a temperature difference of 7 [K] when water enters at 0.05 m/s; thus, outperforming conventional heat sinks with a single inlet fluid line. The opposite inclined inlets promote turbulent thermal boundary layer on the surface of the fins or legs (diagram 2000). Additionally, this creates a uniform temperature field on the CPU's or GPU's Integrated Heat Spreader, HIS surface (diagram 2005).

Of course, this inlet angle $\alpha$ may be varied between 30°-70°. The upper body 107 defines a plurality of first fastener openings 113a-113d at each of the corners. As perhaps best seen in FIG. 1B, the upper body 107 has a six sided irregular hexagon shape cross-section.

The lower body 106 illustratively defines a plurality of second fastener openings 114a-114d at each of the corners and aligned with the plurality of first fastener openings 113a-113d. The lower body 106 illustratively comprises a plurality of medial fins 115a-115i extending upwardly into the fluid chamber 110, and a peripheral seal 116 surrounding the plurality of fins and for fluidly sealing the fluid chamber in cooperation with opposing portions of the upper body 107. The lower body 106 illustratively comprises a peripheral recess 117 directly surrounding the plurality of medial fins 115a-115i. The lower body 106 illustratively comprises a bottom seat protrusion 120 opposite the fluid chamber 110.

The base plate 101 illustratively comprises a plurality of third fastener openings 121a-121d aligned with the plurality of first fastener openings 113a-113d and the plurality of second fastener openings 114a-114d. Once the heatsink device 100 is assembled, fasteners are positioned within the aligned plurality of third fastener openings 121a-121d, the plurality of first fastener openings 113a-113d, and the plurality of second fastener openings 114a-114d to couple to device securely.

The base plate 101 illustratively comprises a medial recess 122, and the opening 104 is therein. The medial recess 122 receives the bottom seat protrusion 120 for abutting the electronic component. The base plate 101 illustratively comprises a plurality of fourth fastener openings 123a-123d respectively within the plurality of legs 103a-103d. The plurality of fourth fastener openings 123a-123d is to receive a respective plurality of fasteners for coupling the heatsink device 100 to a circuit board (e.g. a motherboard).

Figure 5:
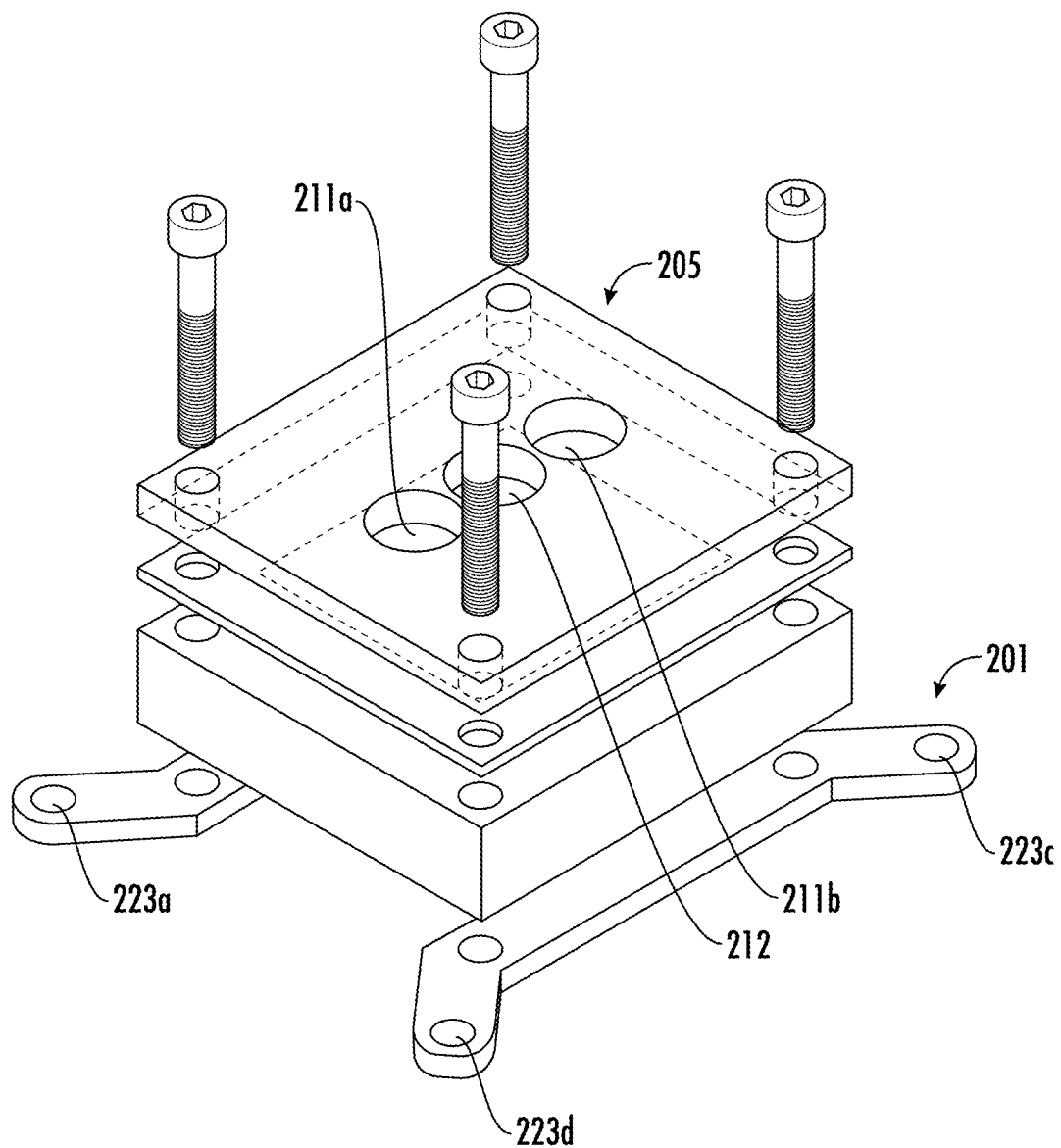
FIG. 5 is a schematic partially exploded perspective view of another embodiment of the heatsink device, according to the present disclosure.

Referring now additionally to FIG. 5, another embodiment of the heatsink device 200 is now described. In this embodiment of the heatsink device 200, those elements already discussed above with respect to FIGS. 1A-4C are incremented by 100 and most require no further discussion herein. This embodiment differs from the previous embodiment in that this heatsink device 200 illustratively includes flat profile upper body.

Figure 6:
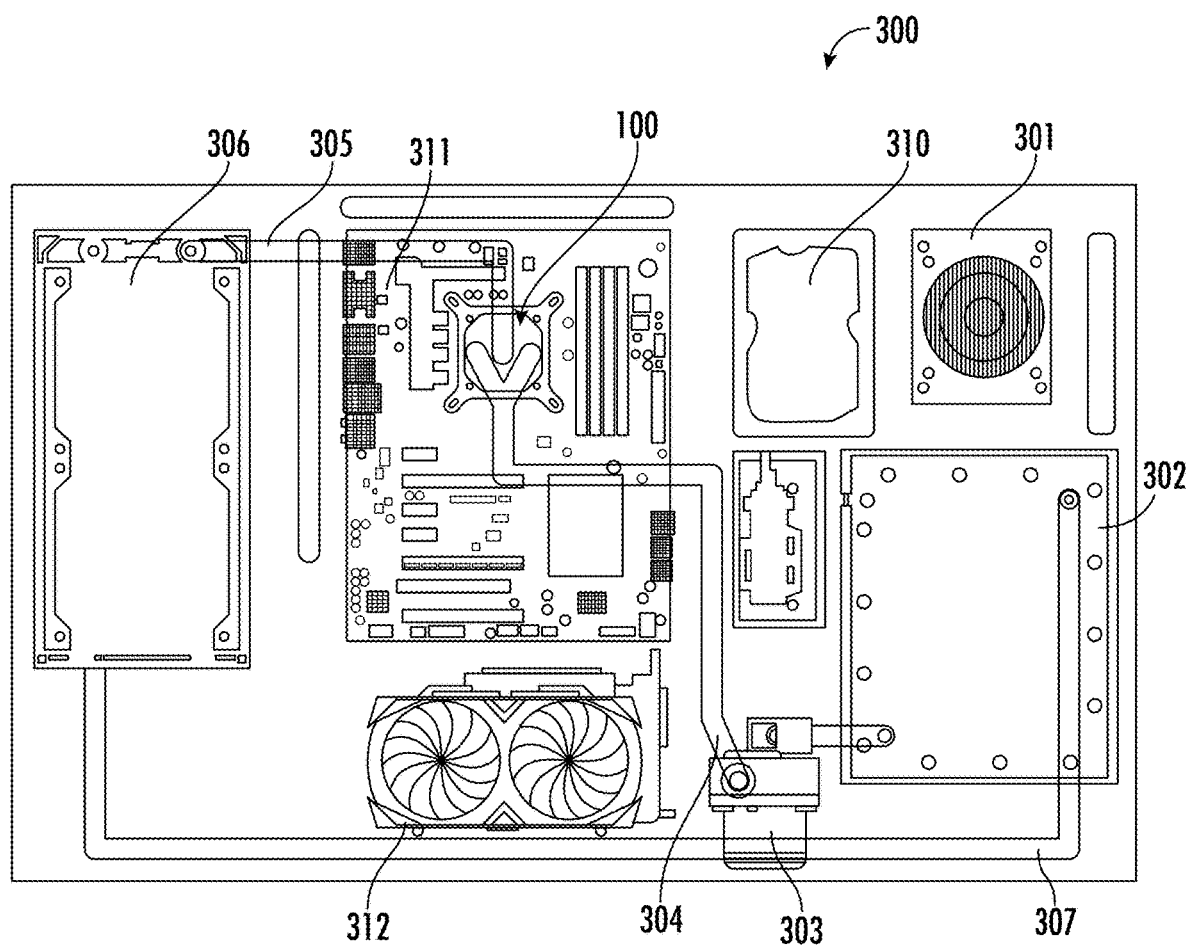
FIG. 6 is a schematic top plan view of a personal computing device housing using the heatsink device of FIG. 1.

Referring now additionally to FIG. 6, an embodiment of a personal computing device housing 300 is now described. This personal computing device housing 300 illustratively comprises a power supply 301, a liquid tank 302, a liquid pump 303 coupled to the liquid tank, an inlet fluid line 304 coupled to the liquid pump, and a heatsink device 100 coupled to the inlet fluid line via the first and second inlet passageways 111a-111b. The personal computing device housing 300 illustratively includes an outlet fluid line 305 coupled to the outlet passageway 112, a radiator 306 coupled to the outlet fluid line, and a return line 307 coupled between the radiator and the liquid tank 302. The personal computing device housing 300 illustratively includes a hard drive 310 coupled to the power supply 301, a motherboard 311 coupled to the power supply, and a GPU 312 coupled to the power supply.

Figure 7A:
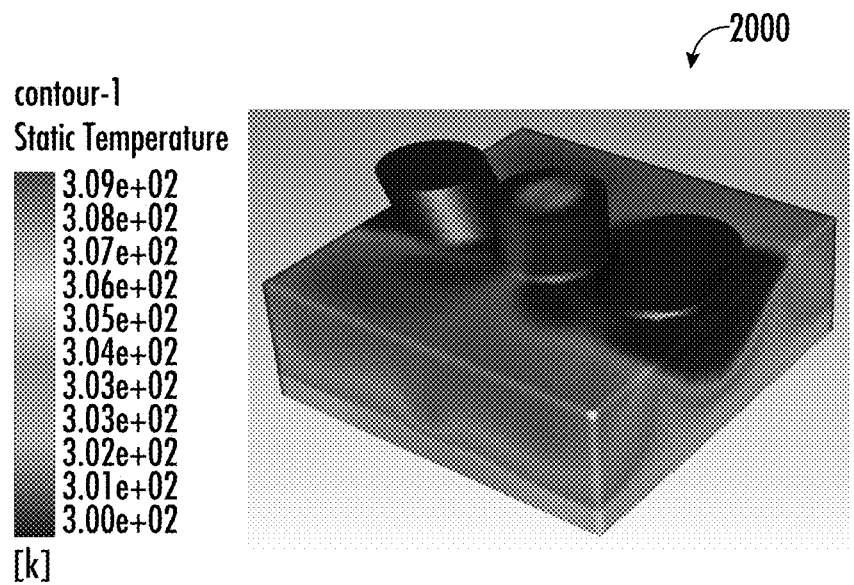
FIGS. 7A and 7B are diagrams of thermal performance of an example embodiment of the heatsink device of FIG. 1.
Figure 7B:
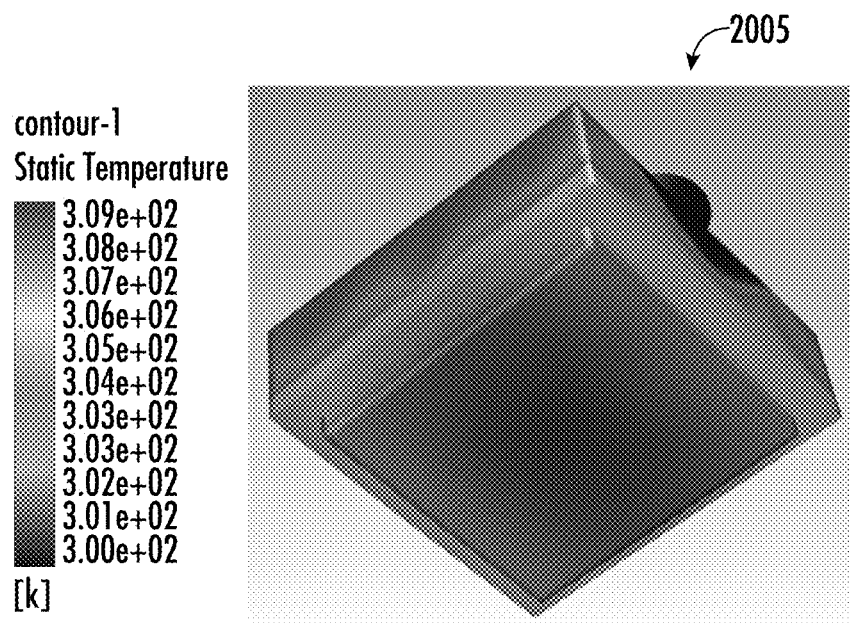

Referring now to FIGS. 7A-7B, diagrams 2000, 2005 show thermal performance of the heatsink device 100. Moreover, performance metrics are shown in Table 1 below.

TABLE 1

| Operating condition: | | | |
|---|---|---|---|
| Thermal design power of CPU's [W] | | | 95.00 |
| Heat on CPU's Integrated Heat Spreader [W/m^3] | | | 6122000 |
| | | | 0 |
| Fluid inlet velocity [m/s] | | | 0.6 |
| Fins or legs material | | | Copper |
| IHS material | | | Nickel |
| Results: | | | |
| Parameter | Max | Min | Average |
| Inlet pressure [Pa] | 156912 | 144956 | 149440 |
| Outlet pressure [Pa] | 0 | 0 | 0 |
| Inlet liquid refrigerant temperature [K] | 300 | 300 | 300 |
| Outlet liquid refrigerant temperature [K] | 310.626 | 288.117 | 300.122 |
| Fins or legs temperature [K] | 305.584 | 295.046 | 301.068 |
| CPU's Integrated Heat Spreader temperature [K] | 307.003 | 300.924 | 304.0 |

Figure 8:
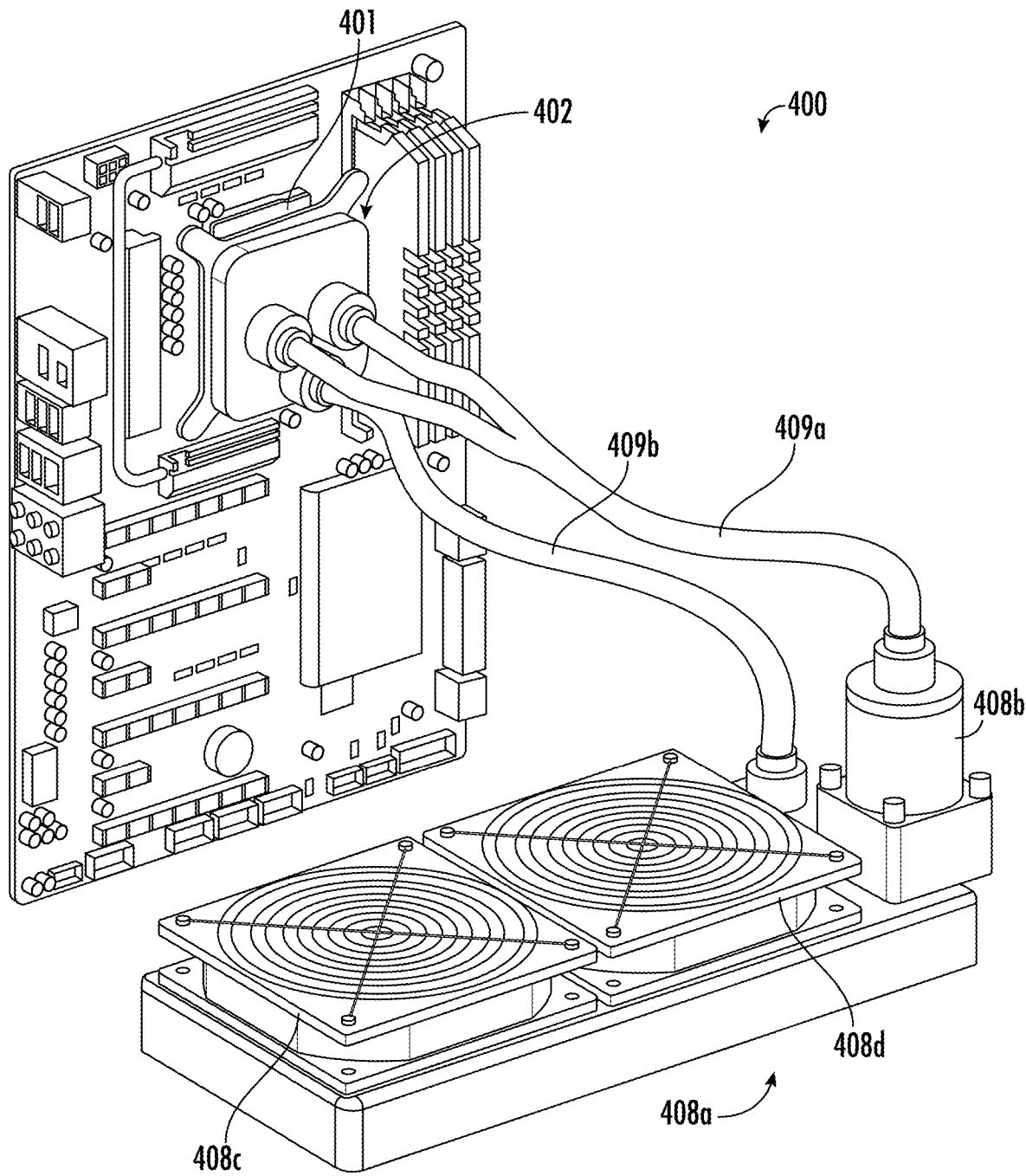
FIG. 8 is a schematic perspective view of a computing device, according to the present disclosure.
Figure 9:
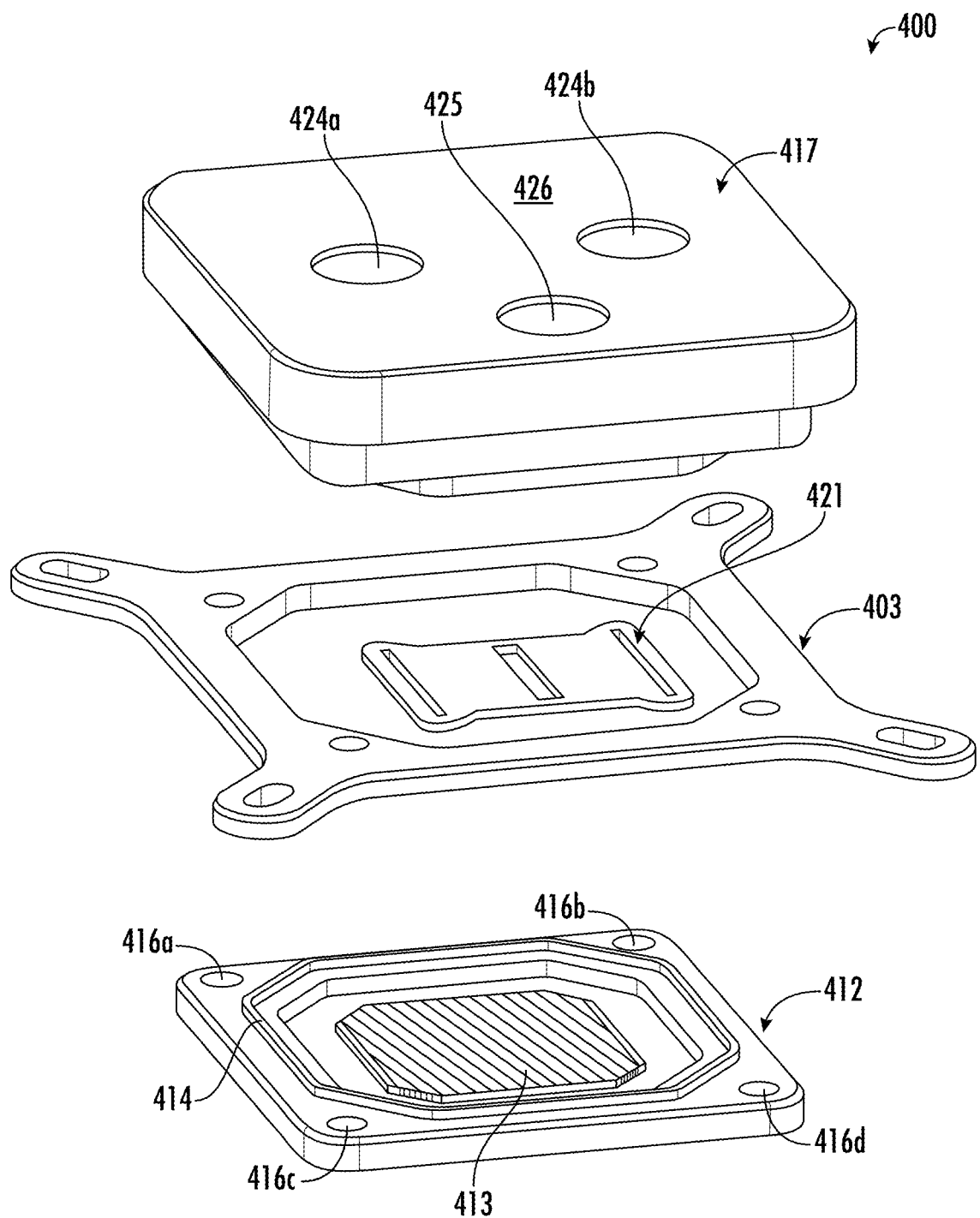
FIG. 9 is a schematic exploded view of the heatsink device from the computing device of FIG. 8.

Referring now to FIG. 8, an embodiment of a computing device 400 according to the present disclosure is now described. The computing device 400 illustratively includes an electronic component 401 (e.g. a processor or GPU), a heatsink device 402 abutting the electronic component, and a radiator 408a fluidly coupled to the heatsink device. The computing device 400 includes a powered impeller module 408b coupled to an outlet of the radiator 408a, and a transmit fluid conduit 409a coupled to an output of the powered impeller module.

The transmit fluid conduit 409a illustratively includes a Y-junction for splitting the fluid outflow from the powered impeller module 408b. The computing device 400 includes a receive fluid conduit 409b coupled between the heatsink device 402 and an input of the radiator 408a. The radiator 408a illustratively includes first and second power fan units 408c-408d.

Referring now additionally to FIGS. 9-16B, the heatsink device 402 illustratively comprises a base plate 403 having a body 404, and a plurality of legs 405a-405d extending laterally outward from the body, and defining an opening 406 (e.g. illustratively octagon shaped) within the body. Each of the plurality of legs 405a-405d illustratively includes a slot shaped opening 407a-407d at a distal end thereof. The body 404 includes a plurality of openings 410a-410d.

The heatsink device 402 illustratively includes a heat exchanger 411 comprising a lower body 412 under the base plate 403 and abutting the electronic component 401. For example, the heat exchanger 411 may comprise one or more of copper, aluminum, gold, or silver. The lower body 412 illustratively includes a plurality of fins 413, and a peripheral ridge 414 surrounding the plurality of fins. As perhaps best seen in FIG. 9, the lower body 412 defines a lower channel 415 between the plurality of fins 413 and the peripheral ridge 414. The lower body 412 also illustratively includes a plurality of openings 416a-416d respectively aligned with the plurality of openings 410a-410d of the base plate 403.

The heatsink device 402 illustratively includes an upper body 417 coupled to the lower body 412 to define a fluid chamber 420 therein. The heatsink device 402 illustratively includes a medial plate 421 between the lower body 412 and the upper body 417. The medial plate 421 illustratively comprises first and second slots 422a-422b, and a medial slot 423 between the first and second slots. Each of the first and second slots 422a-422b, and the medial slot 423 is illustratively shaped to have rounded ends. Also, the medial slot 423 is greater in area than the area of each of the first and second slots 422a-422b.

The upper body 417 defines first and second inlet passageways 424a-424b respectively aligned with the first and second slots 422a-422b. The first and second inlet passageways 424a-424b are fluidly coupled to the Y-junction of the transmit fluid conduit 409a. The upper body 417 defines an outlet passageway 425 for passing a fluid from the fluid chamber 420, and the outlet passageway is fluidly coupled to the receive fluid conduit 409b. The first and second slots 422a-422b are configured to cause the fluid to flow laterally within the fluid chamber 420.

The upper body 417 comprises an upper surface 426, and a lower surface 427 opposite the upper surface. The lower surface 427 comprises a medial protrusion 430 extending downward towards the medial plate 421. The medial protrusion 430 extends through the opening 406 of the base plate 403. The lower surface 427 comprises a peripheral channel 431 surrounding the medial protrusion 430.

Also, the medial protrusion 430 illustratively comprises first and second arms 432a-432b respectively overlapping the first and second inlet passageways 424a-424b. The medial protrusion 430 is illustratively U-shaped and defines a medial recess 433 between the first and second arms 432a-432b. The first and second arms 432a-432b respectively comprise first and second recesses 434a-434b.

Figure 14A:
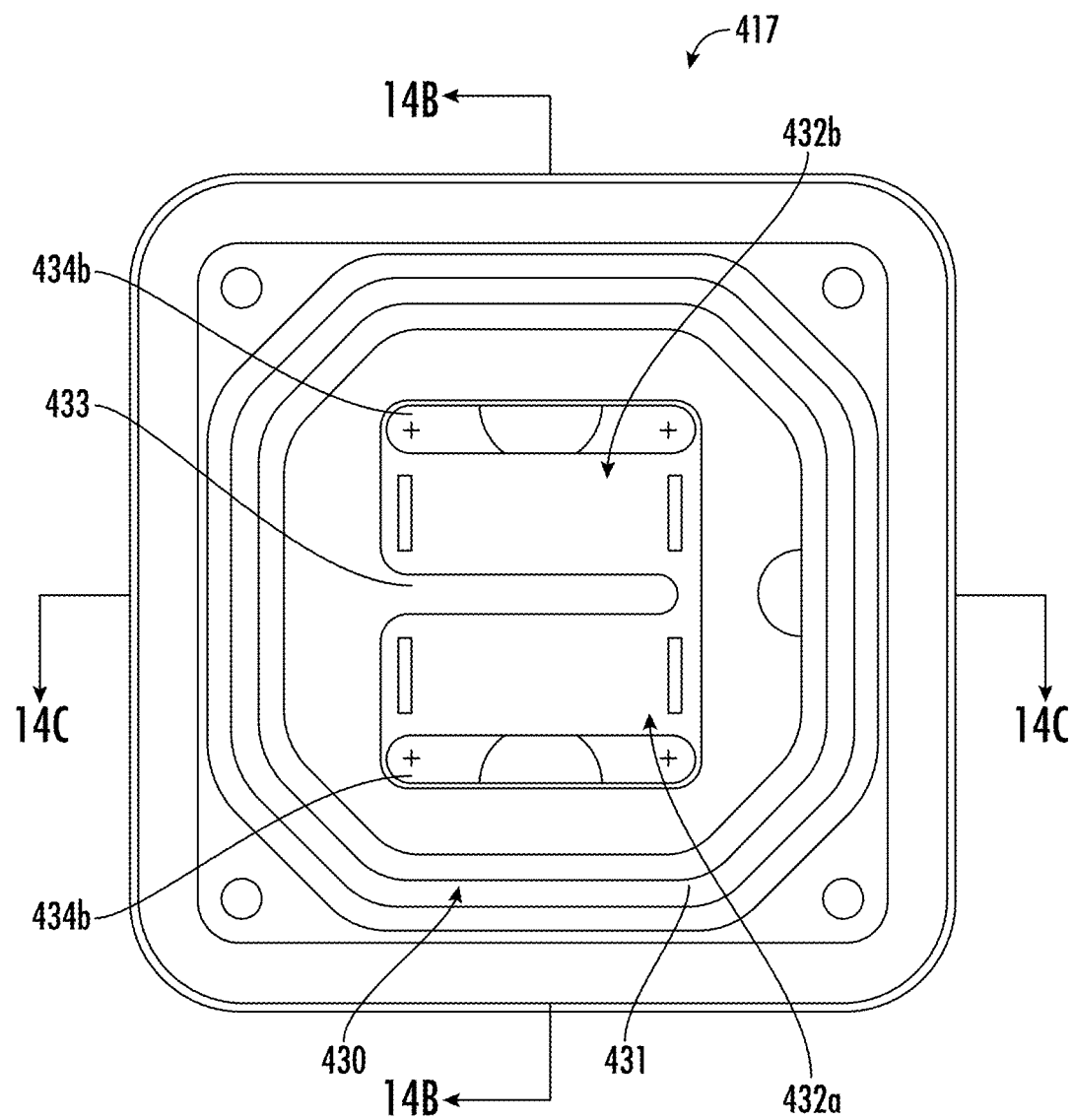
FIG. 14A is a schematic bottom plan view of the upper body of the heatsink device from the computing device of FIG. 8.
Figure 14B:
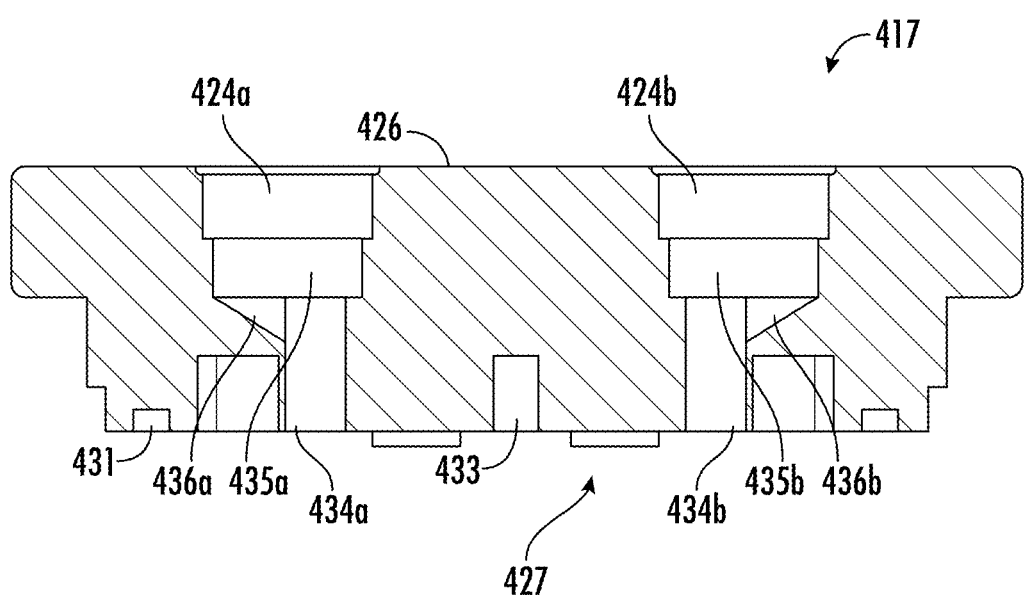
FIG. 14B is a schematic cross-section view of the upper body of FIG. 14A along line 14B-14B.
Figure 14C:
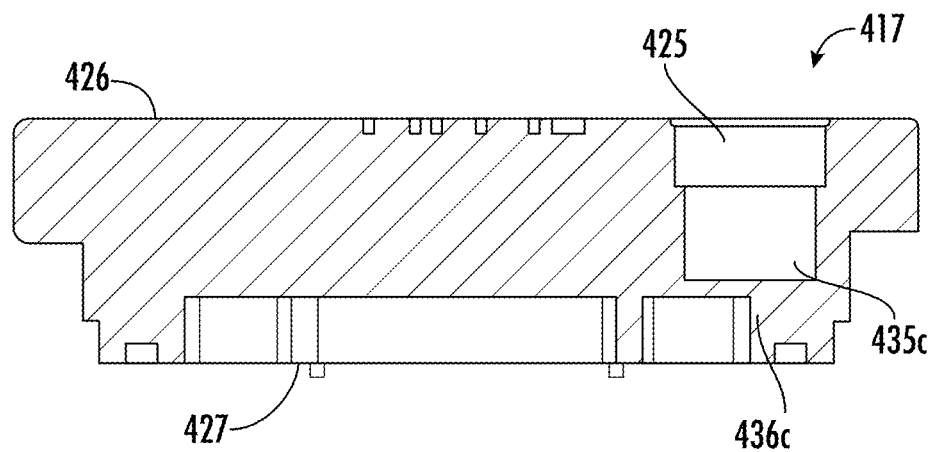
FIG. 14C is a schematic cross-section view of the upper body of FIG. 14A along line 14C-14C.
Figure 14D:
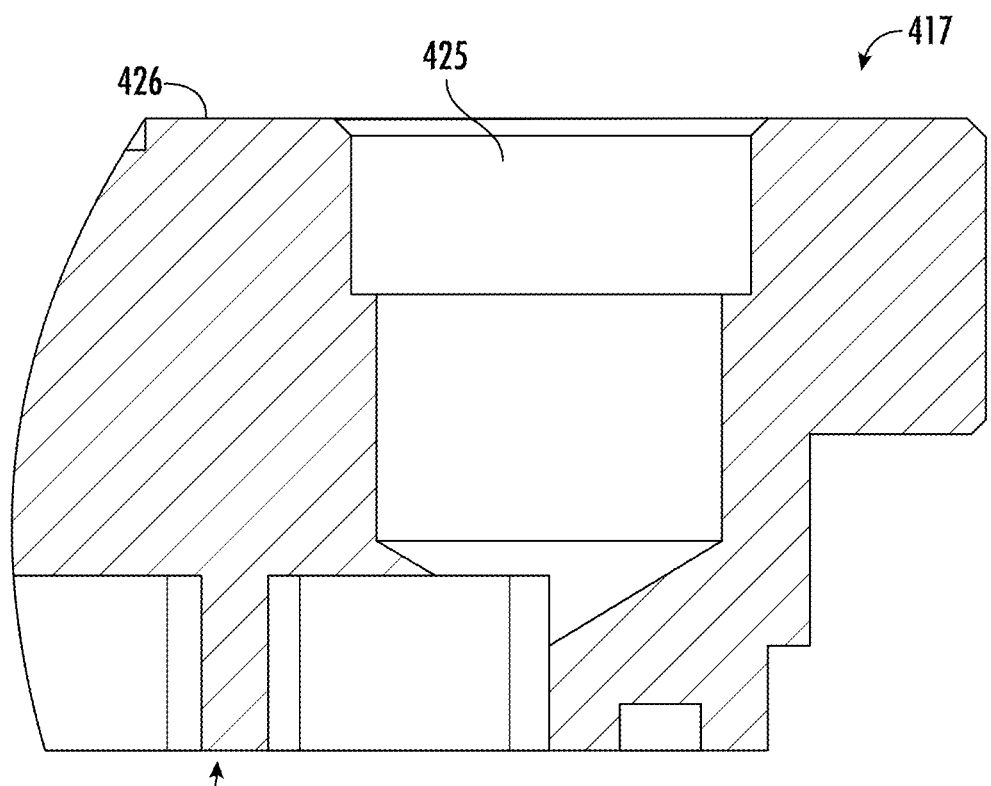
FIG. 14D is a schematic enlarged cross-section view of the upper body of FIG. 14A along line 14C-14C.
Figure 15:
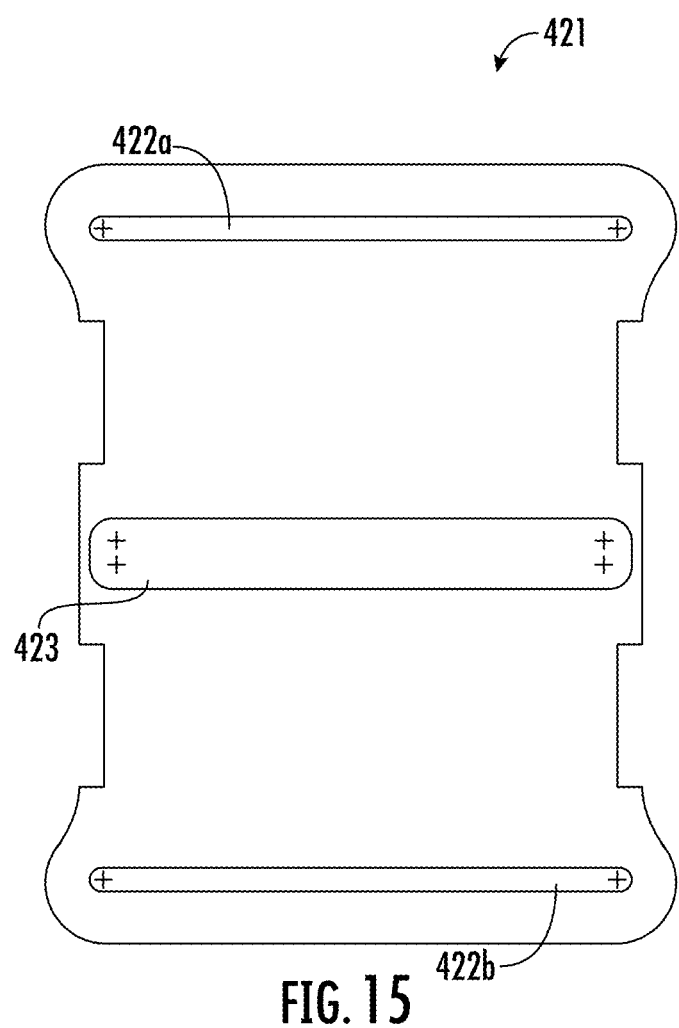
FIG. 15 is a schematic top plan view of the medial plate of the heatsink device from the computing device of FIG. 8.

As perhaps best seen in FIGS. 14B-14C, the upper body 417 comprises first, second, and third fluid conduits 435a-435c respectively fluidly coupled to the first and second inlet passageways 424a-424b, and the outlet passageway 425. Also, each of the first, second, and third fluid conduits 435a-435c has a canted wall 436a-436c to define a funnel.

In the illustrated embodiment, each of the first and second inlet passageways 424a-424b, and the outlet passageway 425 is canted at an inlet angle α of 90° from a horizontal h. Of course, in other embodiments, each of the first and second inlet passageways 424a-424b, and the outlet passageway 425 may be canted at an inlet angle α of 30-90° from the horizontal h.

Figure 10A:
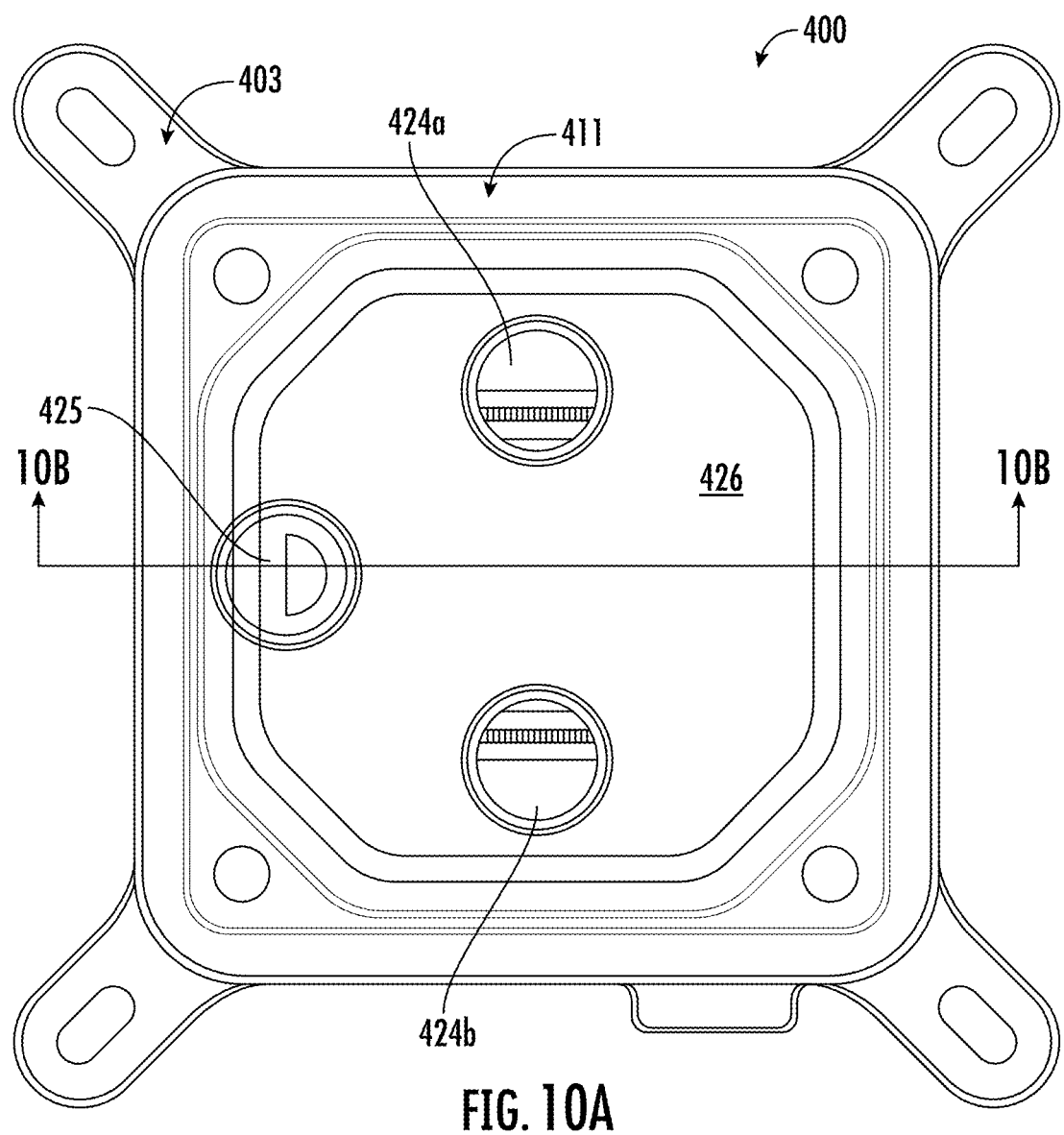
FIG. 10A is a schematic top plan view of the heatsink device from the computing device of FIG. 8.
Figure 10B:
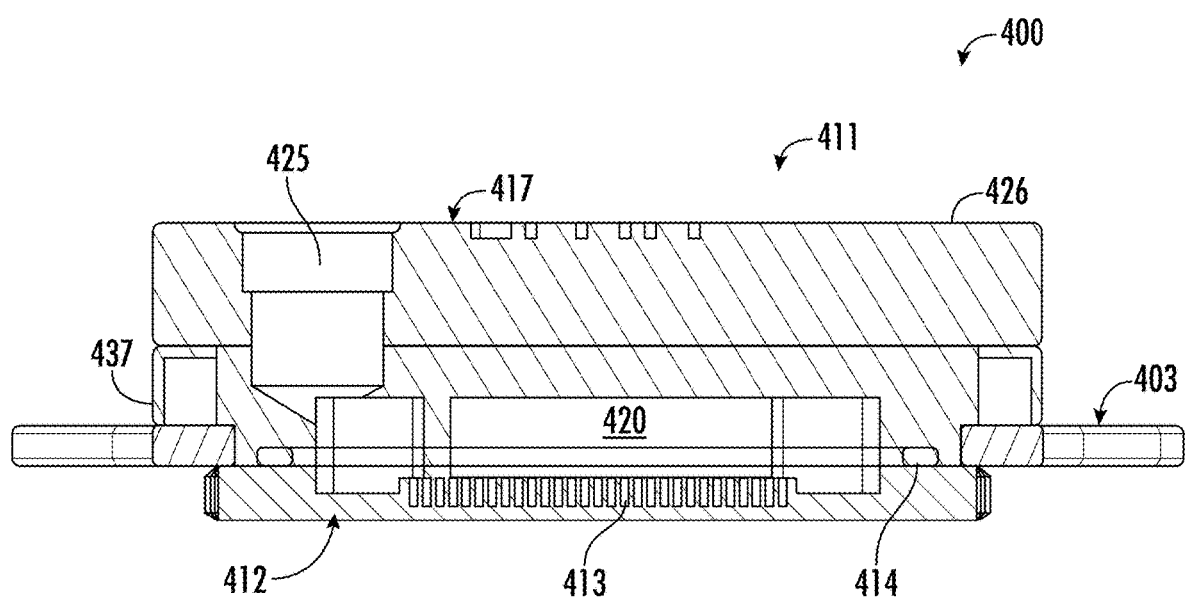
FIG. 10B is a schematic cross-section view of the heatsink device from the computing device of FIG. 8 along line 10B-10B.
Figure 11A:
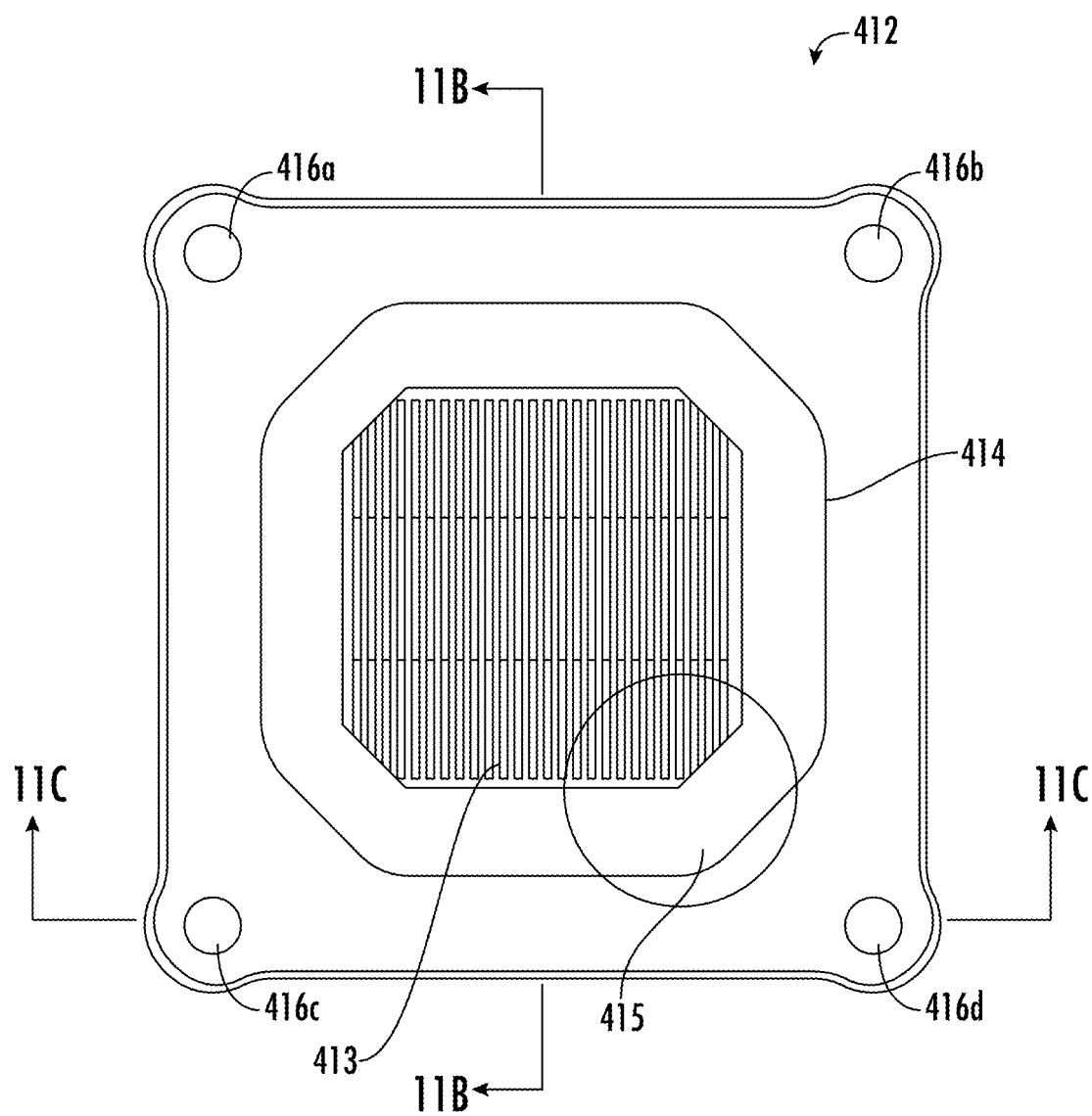
FIG. 11A is a schematic top plan view of the lower body of the heatsink device from the computing device of FIG. 8.
Figure 11B:
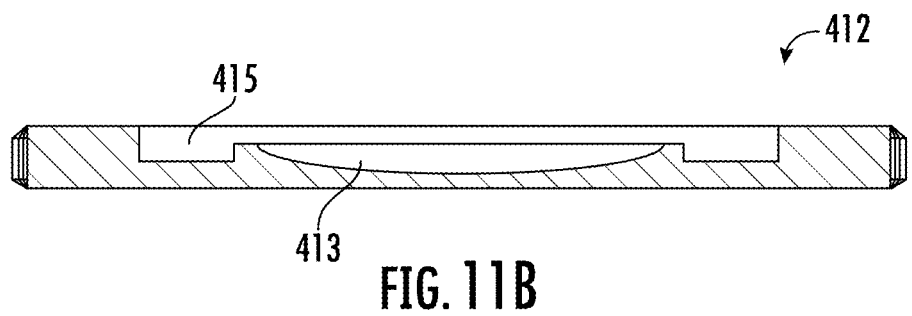
FIG. 11B is a schematic cross-section view of the lower body of FIG. 11A along line 11B-11B.
Figure 11C:
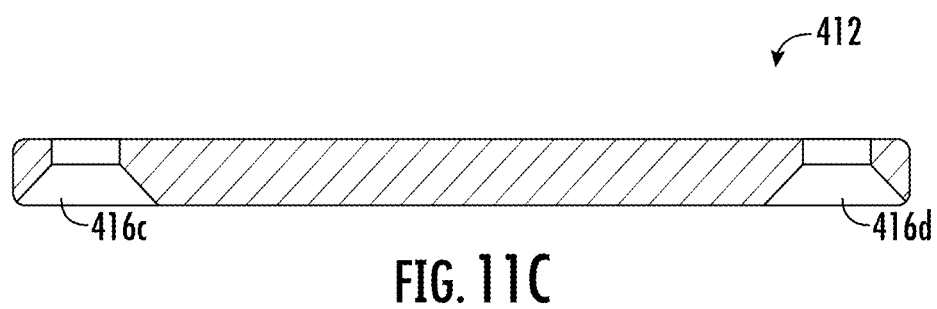
FIG. 11C is a schematic cross-section view of the lower body of FIG. 11A along line 11C-11C.
Figure 11D:
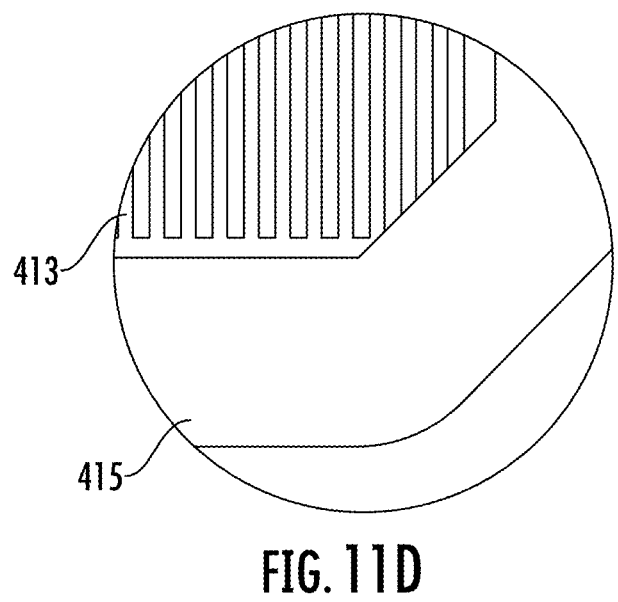
FIG. 11D is a schematic enlarged top plan view of the lower body of FIG. 11A.
Figure 12:
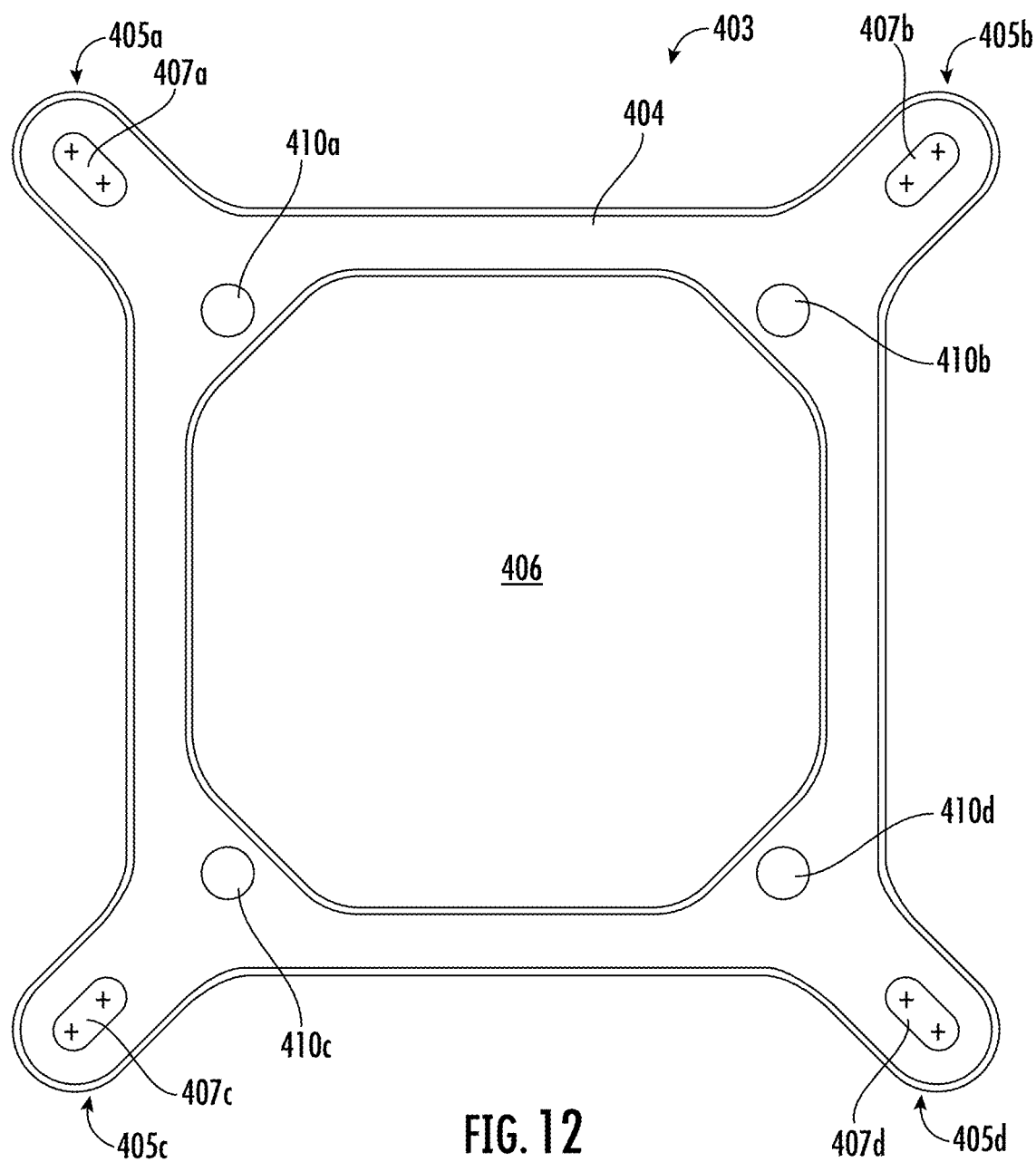
FIG. 12 is a schematic top plan view of the base plate of the heatsink device from the computing device of FIG. 8.
Figure 13:
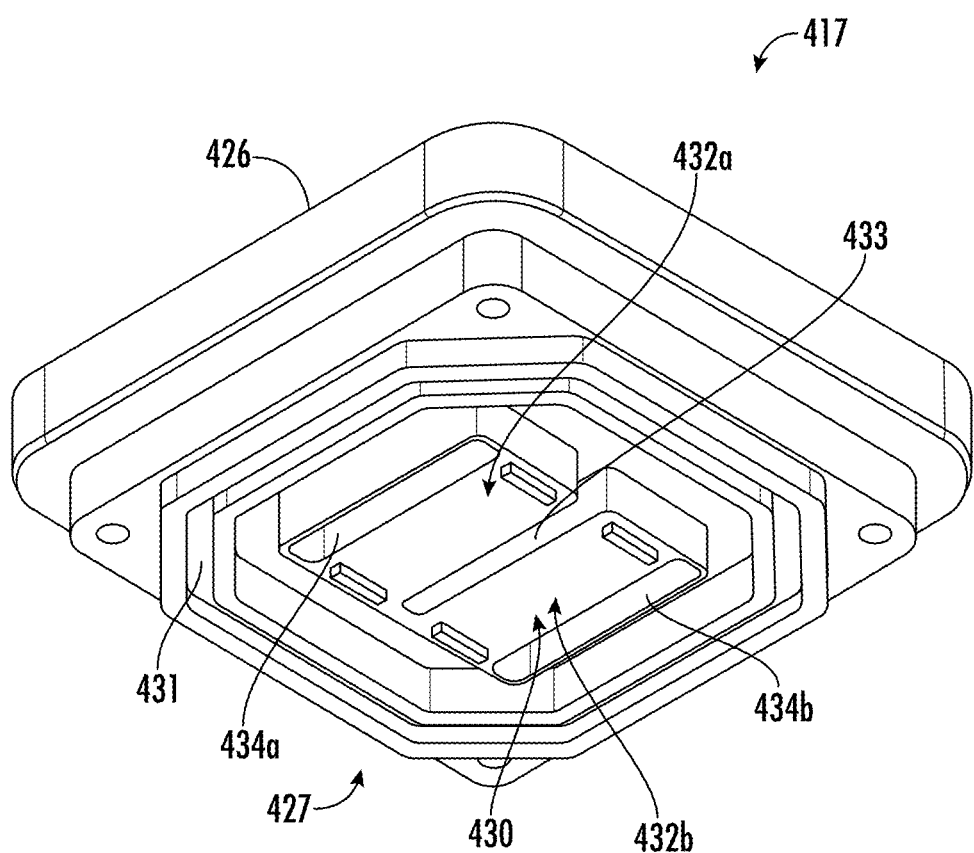
FIG. 13 is a schematic perspective view of the upper body of the heatsink device from the computing device of FIG. 8.
Figure 16A:
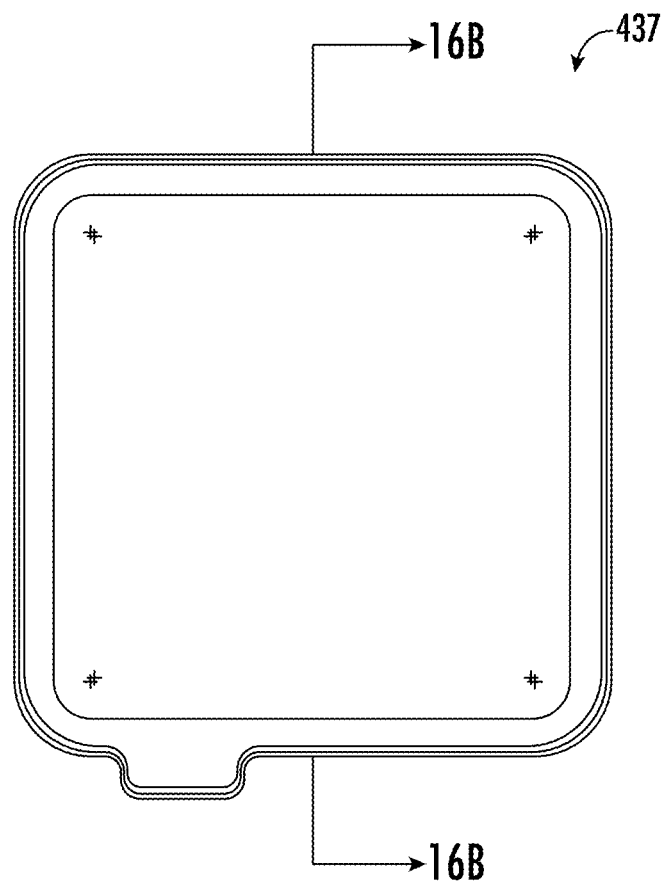
FIG. 16A is a schematic top plan view of the annular ring of the heatsink device from the computing device of FIG. 8.
Figure 16B:
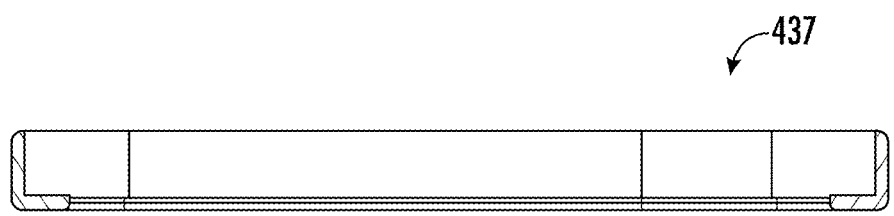
FIG. 16B is a schematic cross-section view of the annular ring of FIG. 16A along line 16B-16B.
Figure 18:
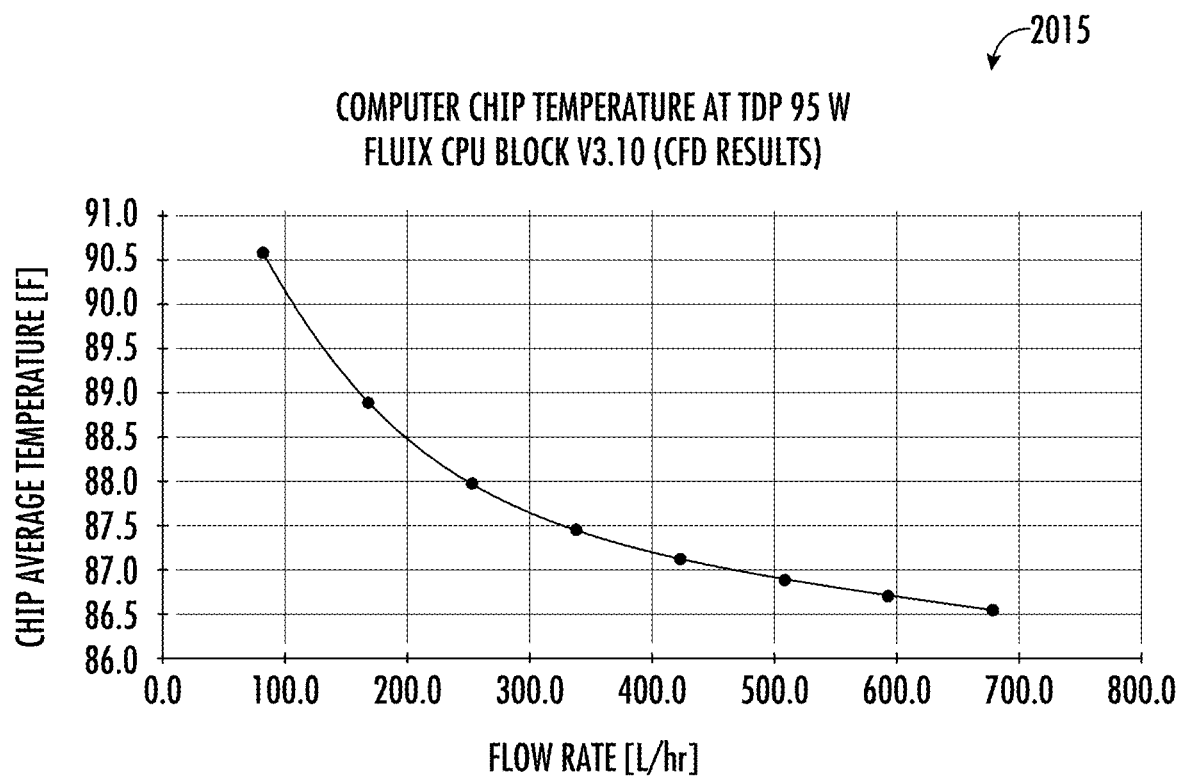
Figure 19:
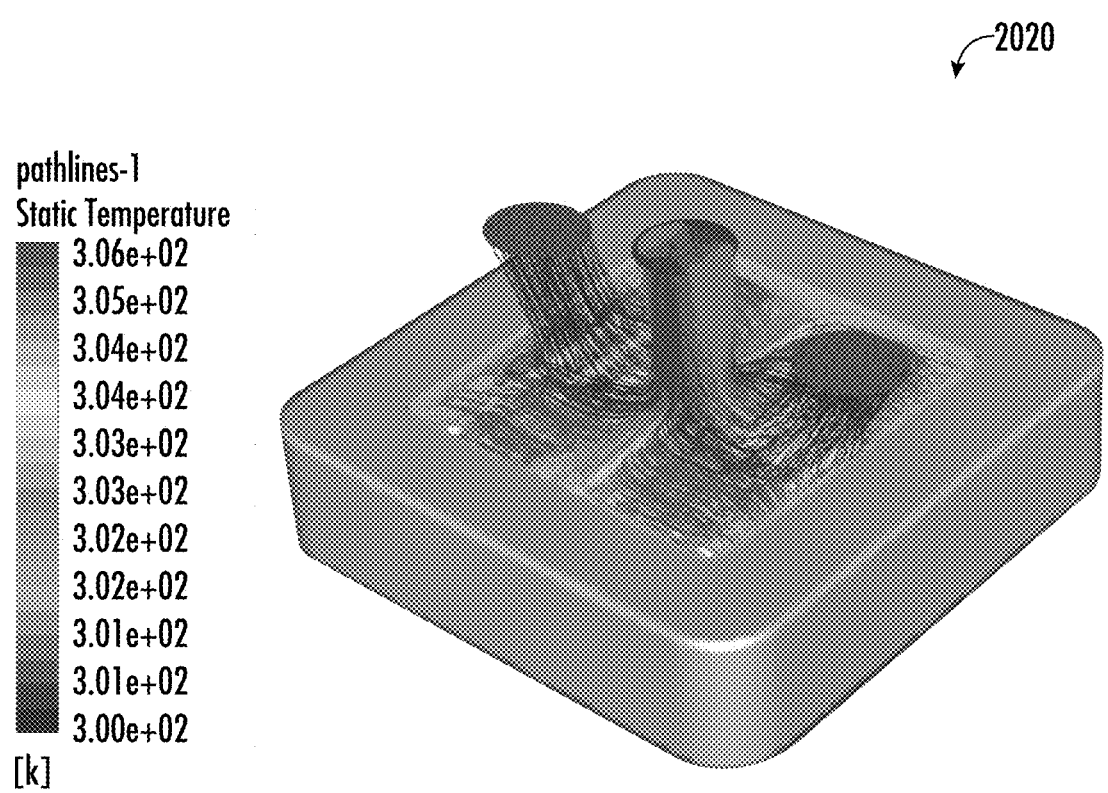
Figure 20:
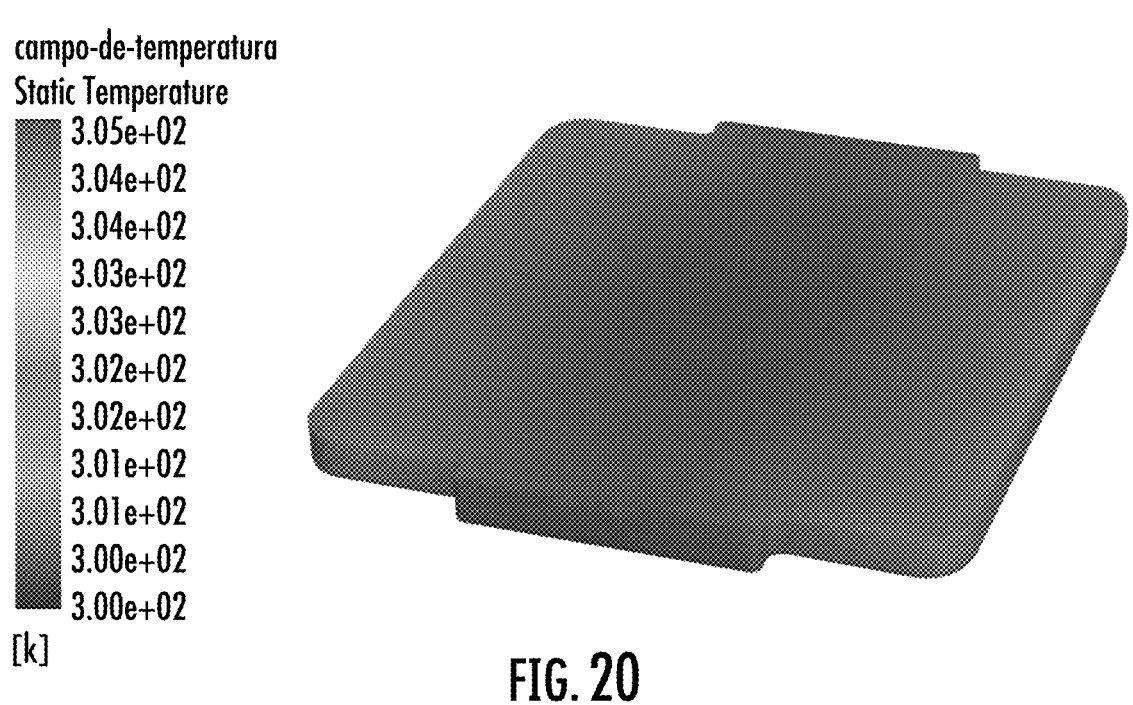

As perhaps best seen in FIGS. 10B & 16A-16B, the heatsink device 402 illustratively includes an annular ring 437 between the upper body 417 and the base plate 403. The medial protrusion 430 extends through the opening in this annular ring 437.

Yet another aspect is directed to a method for making a heatsink device 402 for an electronic component 401. The method includes forming a base plate 403 having a body 404, and a plurality of legs 405a-405d extending laterally outward from the body, and defining an opening 406 within the body. The method further comprises forming a heat exchanger 411 comprising a lower body 412 under the base plate 403 and abutting the electronic component 401, an upper body 417 coupled to the lower body to define a fluid chamber 420 therein, and a medial plate 421 between the lower body and the upper body and having first and second slots 422a-422b therein. The upper body 417 defines first and second inlet passageways 424a-424b respectively aligned with the first and second slots 422a-422b, and an outlet passageway 425 for fluid in the fluid chamber 420. The first and second slots 422a-422b is configured to cause the fluid to flow laterally within the fluid chamber 420.

Referring now to FIGS. 17-20, diagrams 2010, 2015, 2020, 2025 are discussed, and these diagrams demonstrate performance of an example embodiment of the heatsink device 402. In particular, diagrams 2010, 2015 show the benefits of the heatsink device 402. These diagrams provide the raw data of running computational fluid dynamic simulations on the example embodiment of the heatsink device 402 cooling a CPU of 95 Watt heat generation. The simulation is run at various inlet flow rates, and the output result shows the integrated heat spreader (IHS) temperature of the CPU. This data shows how well the example embodiment of the heatsink device 402 performs at various flow rates.

Diagram 2020 shows that turbulence performance has increased in the example embodiment of the heatsink device 402. This refers to the benefit of certain features of the example embodiment of the heatsink device 402, i.e. the medial plate 421, and the inclined inlet passageways. The fluid turbulence is increased over the surface area of the lower body cold plate, increasing the heat transfer rate and lowering the CPU IHS temperature. The diagram 2020 shows how the simulations of the fluid behaves (using streamlines) inside the example embodiment of the heatsink device 402, specifically the increased fluid turbulence.

Diagram 2025 shows a uniform temperature of the chip cooled by the example embodiment of the heatsink device 402. This refers to the benefit of the medial plate 421 forcing fluid to spread evenly across the full surface area of the cold plate fins will result in a more uniform IHS temperature. This is enabled by having multiple inlets from both sides of the upper body lid, and the fluid will converge and cover more of the cold plate area, thereby leading to a lower uniform IHS temperature and limiting hot spots on the CPU.

Many modifications and other embodiments of the present disclosure will come to the mind of one skilled in the art having the benefit of the teachings presented in the foregoing descriptions and the associated drawings. Therefore, it is understood that the present disclosure is not to be limited to the specific embodiments disclosed, and that modifications and embodiments are intended to be included within the scope of the appended claims.

That which is claimed is:

1. A heatsink device for an electronic component, the heatsink device comprising:
   a base plate having a body, and a plurality of legs extending laterally outward from said body, and defining an opening within said body; and
   a heat exchanger comprising
      a lower body under said base plate and abutting the electronic component,
      an upper body coupled to said lower body to define a fluid chamber therein, and
      a medial plate between said lower body and said upper body and having first and second slots therein;
   said upper body defining first and second inlet passageways respectively aligned with said first and second slots, and an outlet passageway for fluid in the fluid chamber;
   said first and second slots configured to cause the fluid to flow laterally within the fluid chamber.

2. The heatsink device of claim 1 wherein said upper body comprises an upper surface, and a lower surface opposite said upper surface; and wherein said lower surface comprises a medial protrusion extending downward towards said medial plate.

3. The heatsink device of claim 2 wherein said medial protrusion extends through the opening of said base plate.

4. The heatsink device of claim 2 wherein said lower surface comprises a peripheral channel surrounding said medial protrusion.

5. The heatsink device of claim 2 wherein said medial protrusion comprises first and second arms respectively overlapping said first and second inlet passageways.

6. The heatsink device of claim 5 wherein said medial protrusion is U-shaped and defines a medial recess between said first and second arms; and wherein said first and second arms respectively comprises first and second recesses.

7. The heatsink device of claim 1 wherein said lower body comprises a plurality of fins, and a peripheral ridge surrounding said plurality of fins.

8. The heatsink device of claim 1 wherein said upper body comprises first and second fluid conduits respectively fluidly coupled to said first and second inlet passageways; and wherein each of said first and second fluid conduits has a canted wall to define a funnel.

9. The heatsink device of claim 1 wherein each of said first and second inlet passageways, and said outlet passageway is canted at an inlet angle α of 30°-90° from a horizontal.

10. A computing device comprising:
    an electronic component;
    a heatsink device abutting said electronic component and comprising
       a base plate having a body, and a plurality of legs extending laterally outward from said body, and defining an opening within said body, and
       a heat exchanger comprising
          a lower body under said base plate and abutting the electronic component,
          an upper body coupled to said lower body to define a fluid chamber therein, and
          a medial plate between said lower body and said upper body and having first and second slots therein,
       said upper body defining first and second inlet passageways respectively aligned with said first and second slots, and an outlet passageway for fluid in the fluid chamber, said first and second slots configured to cause the fluid to flow laterally within the fluid chamber; and a radiator fluidly coupled to said heatsink device.

11. The computing device of claim 10 wherein said upper body comprises an upper surface, and a lower surface opposite said upper surface; and wherein said lower surface comprises a medial protrusion extending downward towards said medial plate.

12. The computing device of claim 11 wherein said medial protrusion extends through the opening of said base plate.

13. The computing device of claim 11 wherein said lower surface comprises a peripheral channel surrounding said medial protrusion.

14. The computing device of claim 11 wherein said medial protrusion comprises first and second arms respectively overlapping said first and second inlet passageways.

15. The computing device of claim 14 wherein said medial protrusion is U-shaped and defines a medial recess between said first and second arms; and wherein said first and second arms respectively comprises first and second recesses.

16. The computing device of claim 10 wherein said lower body comprises a plurality of fins, and a peripheral ridge surrounding said plurality of fins; and wherein said upper body comprises first and second fluid conduits respectively fluidly coupled to said first and second inlet passageways; and wherein each of said first and second fluid conduits has a canted wall to define a funnel.

17. A method for making a heatsink device for an electronic component, the method comprising:

forming a base plate having a body, and a plurality of legs extending laterally outward from the body, and defining an opening within the body; and forming a heat exchanger comprising
a lower body under the base plate and abutting the electronic component,
an upper body coupled to the lower body to define a fluid chamber therein, and
a medial plate between the lower body and the upper body and having first and second slots therein;

the upper body defining first and second inlet passageways respectively aligned with the first and second slots, and an outlet passageway for fluid in the fluid chamber;

the first and second slots configured to cause the fluid to flow laterally within the fluid chamber.

18. The method of claim 17 wherein the upper body comprises an upper surface, and a lower surface opposite the upper surface; and wherein the lower surface comprises a medial protrusion extending downward towards the medial plate.

19. The method of claim 18 wherein the medial protrusion extends through the opening of the base plate.

\* \* \* \* \*